US009625552B2

(12) United States Patent
Paul

(10) Patent No.: US 9,625,552 B2
(45) Date of Patent: Apr. 18, 2017

(54) METHOD AND APPARATUS TO ACQUIRE MAGNETIC RESONANCE DATA

(71) Applicant: Dominik Paul, Bubenreuth (DE)

(72) Inventor: Dominik Paul, Bubenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 754 days.

(21) Appl. No.: 13/949,478

(22) Filed: Jul. 24, 2013

(65) Prior Publication Data

US 2014/0028313 A1    Jan. 30, 2014

(30) Foreign Application Priority Data

Jul. 24, 2012    (DE) .......................... 10 2012 212 983

(51) Int. Cl.
  *G01R 33/56*    (2006.01)
  *G01R 33/561*    (2006.01)

(52) U.S. Cl.
  CPC ......... *G01R 33/56* (2013.01); *G01R 33/5617* (2013.01)

(58) Field of Classification Search
  CPC ...................................... G01R 33/50–33/5676
  See application file for complete search history.

(56) References Cited

U.S. PATENT DOCUMENTS 4,748,409 A    5/1988  Frahm et al.
6,008,647 A    12/1999  Zhou et al.
2007/0013374 A1*  1/2007  Griswold ........... G01R 33/5611
                                                324/309
2008/0278159 A1    11/2008  Park
(Continued)

FOREIGN PATENT DOCUMENTS

DE    10 2011 080 215    2/2013

OTHER PUBLICATIONS

Mugler et al. "Practical Implementation of Optimized Tissue-Specific Prescribed Signal Evolutions for Improved Turbo-Spin-Echo Imaging", Proc. Intl. Soc. Mag. Reson, Med. 11, (2003), p. 203.
(Continued)

*Primary Examiner* — Clayton E Laballe
*Assistant Examiner* — Ruifeng Pu
(74) *Attorney, Agent, or Firm* — Schiff Hardin LLP

(57) ABSTRACT

In a method and apparatus to acquire magnetic resonance data in a selected region of an examination subject without aliasing artifacts and with a reduced acquisition time, a spatially selective excitation pulse is radiated into the examination subject to excite nuclear spins in at least the selected region, and after radiating the excitation pulse, a series of at least two refocusing pulses is radiated into the examination subject, which generate variable flip angles adapted to a predetermined signal curve. At least the second refocusing pulse, and possibly every additional one of the refocusing pulses of this series, is a non-selective pulse. The spin echo signals generated by the refocusing pulses are acquired as magnetic resonance data. Gradients for spatial coding are activated before and after the spatially selective excitation pulse, the refocusing pulses and during the data acquisition. The acquired magnetic resonance data are stored and/or converted into image data for display.

16 Claims, 4 Drawing Sheets

(56) References Cited

U.S. PATENT DOCUMENTS

| | | | |
|---|---|---|---|
| 2010/0160767 A1* | 6/2010 | Deimling | G01R 33/5613 600/419 |
| 2011/0175612 A1 | 7/2011 | Eissa et al. | |
| 2011/0187366 A1* | 8/2011 | Grodzki | G01R 33/4828 324/309 |
| 2011/0267053 A1* | 11/2011 | Li | G01R 33/5617 324/309 |
| 2012/0313641 A1* | 12/2012 | Labadie | G01R 33/4818 324/309 |
| 2013/0033263 A1* | 2/2013 | Fautz | G01R 33/56545 324/309 |
| 2015/0268317 A1* | 9/2015 | Blumhagen | G01R 33/20 324/309 |

OTHER PUBLICATIONS

Mugler et al., "Three dimensional T2-weighted imaging of the brain using very long spin-echo trains", in: Proceedings of the 8th Annual Meeting of ISMRM, Denver, CO, (2000) p. 687.

Mugler et al. "Efficient Spatially-Selective Single-Slab 3D Turbo-Spin-Echo-Imaging"; in: Proc. Intl. mag. Reson. Med. 11; (2004); p. 695.

Mugler et. al., "3D-Turbo-Spin-Echo Imaging with up to 1000 Echoes per Excitation: From Faster Acquisitions to Echo-Volumar Imaging"; in: Proc.Intl. Mag. Reson. Med. 11; (2004); p. 2106.

Mugler et al. "Fat-signal Suppression in Single-slab 3D TSE (SPACE) using Water-Selective Refocusing"; Proc. Intl. Soc. Mag. Reson. Med. 19; (2011); p. 2818.

Park et al. "Reduction of B1 Sensitivity in Selective Single-Slab 3D Turbo Spin Echo Imaging with Very Long Echo Trains"; Magnetic Resonance in Medicine; vol. 62; (2009); pp. 1060-1066.

* cited by examiner

METHOD AND APPARATUS TO ACQUIRE MAGNETIC RESONANCE DATA

BACKGROUND OF THE INVENTION

Field of the Invention

The invention concerns a method to acquire magnetic resonance data as well as a magnetic resonance system and an electronically readable data storage medium to implement such a method.

Description of the Prior Art

Magnetic resonance (MR) is a known modality with which images of the inside of an examination subject can be generated. Expressed in a simplified manner, the examination subject in a magnetic resonance apparatus is positioned in a strong, static, homogeneous basic magnetic field (called a $B_0$ field) with a field strength of 0.2 to 7 Tesla or more, such that nuclear spins in the subject orient along the basic magnetic field. Radio-frequency excitation pulses (RF pulses) are radiated into the examination subject to trigger nuclear magnetic resonance signals that are detected and entered in an organized manner as data points in an electronic memory known as k-space. On the basis of the k-space data, MR images are reconstructed or spectroscopy data are determined. Rapidly switched magnetic gradient fields are superimposed on the basic magnetic field for spatial coding of the measurement data. The acquired measurement data are digitized and stored as complex numerical values in a k-space matrix. For example, by means of a multidimensional Fourier transformation, an associated MR image can be reconstructed from the k-space matrix populated with values.

In the acquisition of magnetic resonance data for imaging, MR from the subject (or volume thereof) to be imaged must be acquired completely in all phase coding directions in order to avoid aliasing artifacts. Particularly in three-dimensional acquisition techniques, which use two phase coding directions for the spatial resolution, the flexibility in the adjustment of the parameters to be used in the acquisition is thereby reduced, or the duration of the acquisition is increased, thereby reducing the desirability of such acquisition techniques in everyday clinical settings.

Often techniques known as "oversampling" techniques, in which additional data are measured (acquired) in the phase coding direction but are discarded in the reconstruction, have been used to avoid aliasing artifacts. However, the measurement time is thereby increased (drastically in some circumstances), which can also lead to problems with the permitted specific absorption rate (SAR).

SUMMARY OF THE INVENTION

An object of the present invention is to provide a method to acquire magnetic resonance data and a magnetic resonance system and an electronically readable data storage medium that avoid aliasing artifacts without increasing the measurement time.

A method according to the invention to acquire magnetic resonance data in a selected region of an examination subject by means of a magnetic resonance system following the steps.

A spatially selective excitation pulse is radiated into the examination subject to excite at least the selected region.

After radiating the excitation pulse, a series of at least two refocusing pulses is radiated into the examination subject, which generate variable flip angles adapted to a predetermined signal curve, with at least the second refocusing pulse, and possibly every additional one of the refocusing pulses of this series, being a non-selective pulse.

The spin echo signals generated by the refocusing pulses are acquired as magnetic resonance data.

Gradients are activated for spatial coding before and after the spatially selective excitation pulse, the refocusing pulses and during the data acquisition.

The acquired magnetic resonance data are stored or converted into image data for display.

According to the invention, the spatially selective excitation pulse causes the excited region to already be limited, at least in the phase coding direction, to the selected region from which magnetic resonance data are to be acquired without aliasing artifacts arising. The selected region may be spatially limited in all three spatial directions (for example the x-, y- and z-directions) either solely by the excitation pulse, or by the excitation pulse and the first refocusing pulse. For this purpose, it is sufficient for the spatially selective excitation pulse to excite only the selected region in the respective phase coding direction or the respective phase coding directions. With the method, upon excitation a selected region in the target volume to which the acquisition of the magnetic resonance data should be limited can thus already be "cut out". The measurement time can be reduced since fewer data must be acquired.

With the series of at least two refocusing pulses after an excitation pulse, an echo train the same number of spin echoes is generated. Because the refocusing pulses generate variable flip angles adapted to a predetermined signal curve, particularly long echo trains can be generated by an appropriate number of refocusing pulses without the signal intensities of the echoes declining too much. Suitable methods to determine and implement the variable flip angles are known from, for example, Mugler, Kiefer and Brookeman: "Three-Dimensional T2-Weighted Imaging of the Brain Using Very Long Spin-Echo Trains", Proc. ISMRM 8 (2000) Page 687; Mugler, Meyer and Kiefer: "Practical Implementation of Optimized Tissue-Specific Prescribed Signal Evolutions for Improved Turbo-Spin-Echo Imaging", Proc. ISMRM 11 (2003) Page 203; Mugler and Brookeman: "3D Turbo-Spin-Echo Imaging with up to 1000 Echoes per Excitation: From Faster Acquisitions to Echo-Volumar [sic] Imaging", Proc. ISMRM 11(2004) Page 2106; and Mugler and Brookeman: "Efficient Spatially-Selective Single-Slab 3D Turbo-spin-Echo Imaging", Proc. ISMRM 11 (2004) Page 695.

The spatially selective excitation pulse is an excitation pulse radiated in parallel by at least two (for example eight), sixteen or thirty-two transmission channels of a multichannel RF transmission coil. In this way—with the parallel transmission technique—it is possible to very precisely generate two-dimensional or even three-dimensional spatial excitation pulses.

In contrast to older sequences, such as a TSE sequence ("Turbo Spin Echo") or an FSE sequence ("Fast Spin Echo"), the readout module of the pulse sequence according to the invention advantageously corresponds to a SPACE sequence ("Sampling Perfection with Application optimized Contrasts using different flip angle Evolutions"). The SPACE sequence has proven to be a viable sequence compared to the older TSE and FSE sequences, for example due to the variable flip angles and the long echo train lengths that can occur that are considered less desirable in practice. SPACE allows high-resolution, three-dimensional (3D) image examination subject to be created in a shorter amount of time. The SPACE sequence is a single slice 3D turbo spin echo (TSE) sequence with application-specific variable flip angles.

A magnetic resonance system according to the invention for the acquisition of magnetic resonance data in a selected region within an examination subject has an MR data acquisition unit with a basic field magnet; a gradient field system; at least one RF antenna that has at least one multichannel RF transmission coil, and a control device to operate the gradient field system and the at least one RF antenna, to receive the measurement signals detected by the at least one RF antenna, and to evaluate the measurement signals and generate the magnetic resonance data, and a computer to determine flip angles adapted to a predetermined signal curve. The control unit operates the magnetic resonance system such that a selected region is excited with a spatially selective excitation pulse, and to radiate a series of at least two refocusing pulses in the examination subject after the spatially selective excitation pulse in order to generate spin echo signals in the selected region. The refocusing pulses generate variable flip angles adapted to a predetermined signal curve, and at least the second refocusing pulse (and possibly every further one of the refocusing pulses) of this series is a non-selective pulse. The control unit furthermore operates the magnetic resonance system to acquire the generated spin echo signals as magnetic resonance data, and to activate the refocusing pulses before and after the spatially selected excitation pulse, and to activate gradients for spatial coding during the data acquisition. The control unit causes the acquired magnetic resonance data to be stored as a data file and/or to be transferred into image data for display. The image data also can be stored as a data file.

The present invention also encompasses a non-transitory data storage medium encoded with programming instructions that, when the storage medium is loaded into a computerized control and evaluation system of a magnetic resonance apparatus, cause the control and evaluation system and the magnetic resonance apparatus to be operated in order to execute any of the above-described embodiments of the method according to the invention.

The above-described advantages and embodiments of the method apply analogously to the magnetic resonance system and the electronically readable data storage medium.

DESCRIPTION OF THE PREFERRED EMBODIMENTS

Figure 1:
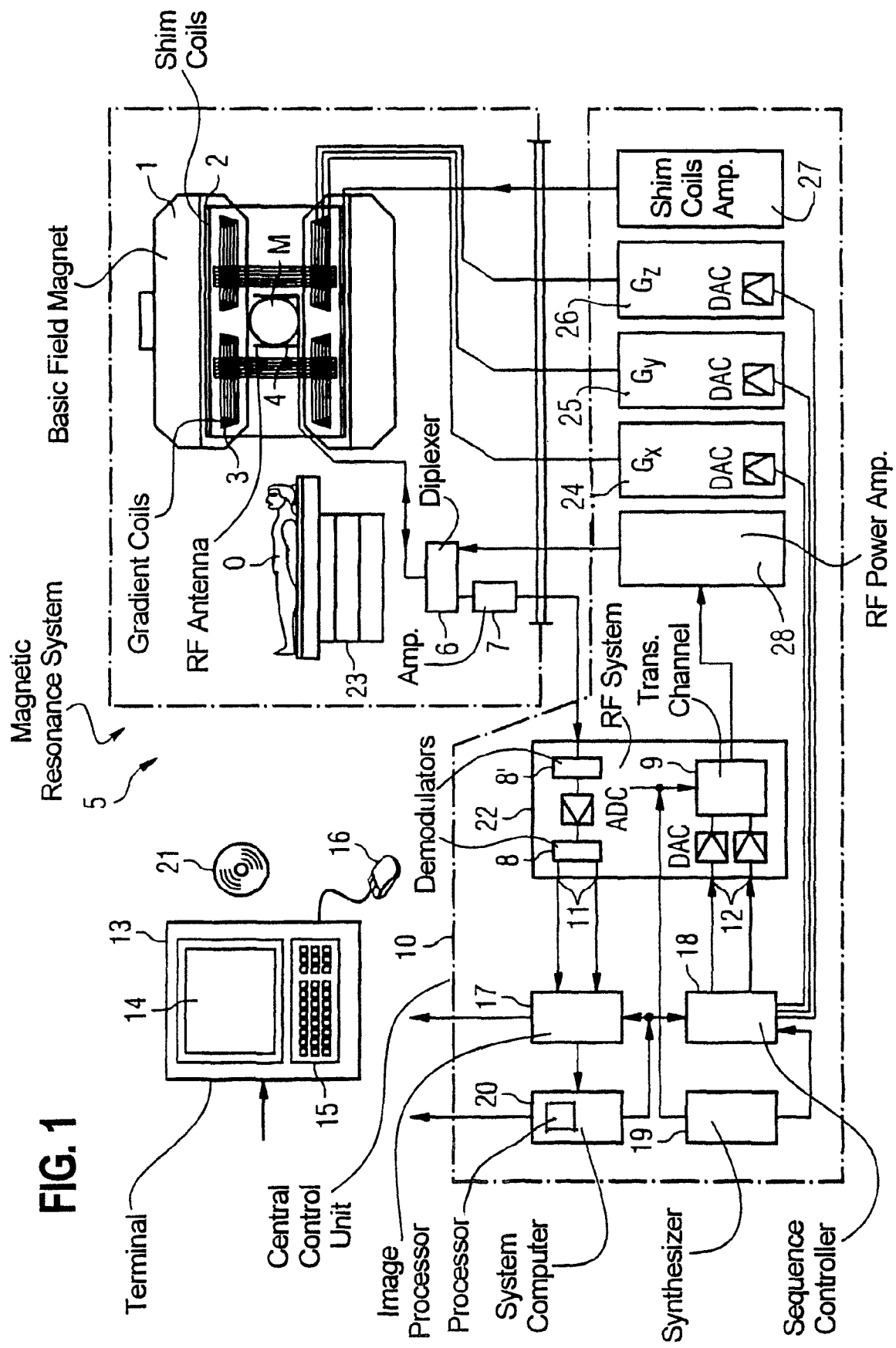
FIG. 1 schematically illustrates a magnetic resonance system according to the invention.

FIG. 1 is a schematic representation of a magnetic resonance system 5 (a magnetic resonance imaging or magnetic resonance tomography apparatus). A basic field magnet 1 generates a temporally constant, strong magnetic field for polarization or alignment of the nuclear spins in a selected region O of an examination subject U, for example of a part of a human body that is to be examined. The subject 10 lies on a table 23 and is moved into the magnetic resonance system 5. The high homogeneity of the basic magnetic field that is required for the magnetic resonance measurement (data acquisition) is defined in a typically spherical measurement volume M into which the parts of the human body that are to be examined are introduced. Shim plates made of ferromagnetic material are attached at suitable locations to assist the homogeneity requirements, and in particular to eliminate temporally invariable influences. Temporally variable influences are eliminated by shim coils 2, supplied with appropriate signals by shim coils amplifier 27.

A cylindrical gradient coil system 3 composed of three sub-windings is located in the basic field magnet 1. Each sub-winding is supplied with current by an amplifier to generate a linear (also temporally variable) gradient field in a respective direction of the Cartesian coordinate system. The first sub-winding of the gradient field system 3 generates a gradient $G_x$ in the x-direction; the second sub-winding generates a gradient $G_y$ in the y-direction; and the third sub-winding generates a gradient $G_z$ in the z-direction. The amplifier includes a digital/analog converter that is activated by a sequence controller 18 for accurately-timed generation of gradient pulses.

Located within the gradient field system 3 are one or more radio-frequency antennas 4, including at least one multichannel RF transmission coil and at least one RF reception coil, which convert the radio-frequency pulses emitted by a radio-frequency power amplifier 28 into an alternating magnetic field for excitation of the nuclei so as to "flip" the nuclear spins of the examination subject U, or of the region of the selected region O of the examination subject U that is to be examined, out of the aforementioned alignment. Each radio-frequency antenna 4 has one or more RF transmission coils and multiple RF reception coils in the form of an annular, preferably linear or matrix-like, arrangement of component coils. The alternating field emanating from the precessing nuclear spins—i.e. normally the spin echo signals caused by a pulse sequence composed of one or more radio-frequency pulses and one or more gradient pulses—is also converted by the RF reception coils of the respective radio-frequency antenna 4 into a voltage (measurement signal) that is supplied via an amplifier 7 to a radio-frequency reception channel 8 of a radio-frequency system 22. The radio-frequency system 22 furthermore has a transmission channel 9 in which the radio-frequency pulses are generated for the excitation of the nuclear spins to produce magnetic resonance signals. The respective radio-frequency pulses are digitally represented in the sequence controller 18 as a series of complex numbers based on a pulse sequence predetermined by the system computer 20, which includes a processor 24 to determine flip angles adapted to a predetermined signal curve. This number sequence is supplied as a real part and an imaginary part to digital/analog converter in the radio-frequency system 22 respective inputs 12, and from the digital/analog converters to the transmission channel 9. In the transmission channel 9, the pulse sequences are modulated on a radio-frequency carrier signal having a base frequency corresponds to the center frequency.

The switching from transmission operation to reception operation takes place via a transmission/reception diplexer 6. The RF transmission coils of the radio-frequency antenna(s) 4 radiate(s) the radio-frequency pulses for excitation of the nuclear spins into the measurement volume M, and resulting echo signals are scanned via the RF reception coil(s). The acquired nuclear magnetic resonance signals are phase-sensitively demodulated to an intermediate frequency in a reception channel 8' (first demodulator) of the radio-frequency system 22 and digitized in an analog/digital converter (ADC). This signal is further demodulated to a frequency of 0. The demodulation to a frequency of 0 and the separation into real part and imaginary part occur in a second demodulator 8 after the digitization in the digital domain. An MR image or three-dimensional image data set can be reconstructed by an image computer 17 from the measurement data acquired in such a manner. The administration of the measurement data, the image data and the control programs takes place via the system computer 20. Based on a specification with control programs, the sequence controller 18 monitors the generation of the respective desired pulse sequences and the corresponding scanning of k-space. The sequence controller 18 controls the accurately-timed switching of the gradients, the emission of the radio-frequency pulses with defined phase amplitude and the reception of the magnetic resonance signals.

The time base for the radio-frequency system 22 and the sequence controller 18 is provided by a synthesizer 19. Via a terminal 13, the selection of appropriate control programs to generate the acquisition of magnetic resonance data (the programs are stored on a DVD 21, for example), the selection of a selected region O that is to be excited and from which magnetic resonance data are to be received, the specification of a substance with which the selected region O is filled to determine the flip angles for the desired signal curve, and the presentation of a generated MR image take place. The terminal 13 can include, for example, a keyboard 15, a mouse 16 and a monitor 14.

Figure 2:
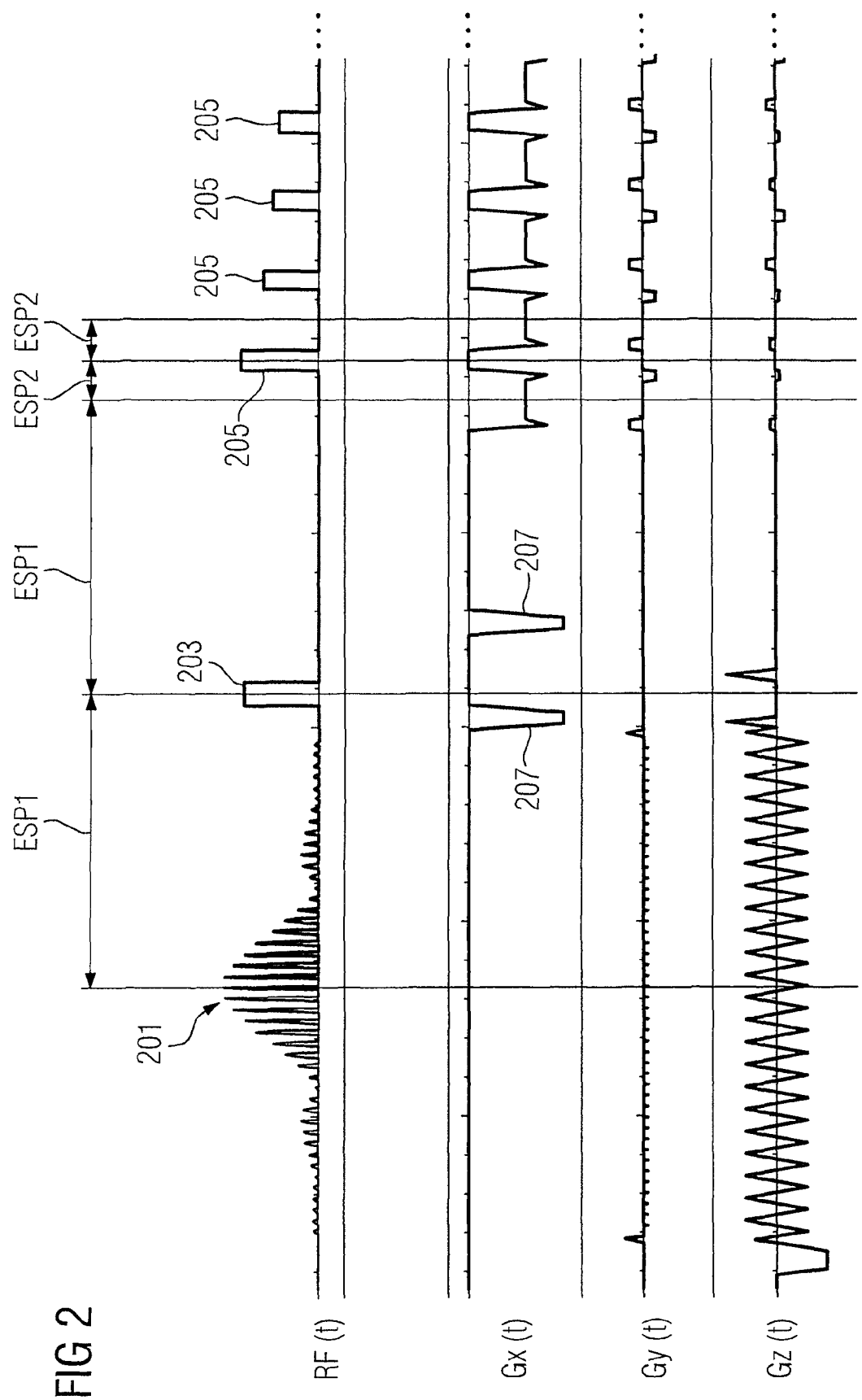
FIG. 2 shows an example of a pulse sequence that can be used in the method according to the invention.

FIG. 2 shows a pulse sequence over the course of time t as it can be used in the present invention. The radiated radio-frequency pulses are shown in the upper line (RF(t)): a spatially selective excitation pulse 201 is initially radiated. In the shown example, a 3D-selective excitation pulse is radiated and generated simultaneously one or more transmission antennas. Flexible excitation pulses that excite only a desired area in the examination subject can be generated by the use of multiple transmission antennas.

After the spatially selective excitation pulse 201, a first refocusing pulse 203 is radiated that refocuses the spins. In the example shown in FIG. 2, the first refocusing pulse is a non-selective pulse.

The first refocusing pulse 203 can be a 180° pulse, and thus generates a flip angle of approximately 180° in order to generate a pure spin echo with high signal. The time interval to the subsequent pulses is determined by the length of the excitation pulse 201. The resulting time constants ESP1 and ESP2 are plotted in FIG. 2.

After the first refocusing pulse 203, at least one additional refocusing pulse 205 follows so that a series of at least two refocusing pulses follows a spatially selected excitation pulse. Up to a few thousand refocusing pulses can be included in a series of refocusing pulses, for example on the order of 200 to 500 (or even up to approximately 3000) refocusing pulses. As is indicated by the decreasing amplitude of the refocusing pulses 205 of the series of at least two refocusing pulses, the refocusing pulses 205 generate variable flip angles respectively adapted to a predetermined signal curve. The signal curve is dependent on a predetermined substance with which the selected region is filled. Upon readout of the magnetic resonance data generated by the refocusing pulse, a predetermined signal strength can be achieved for the respective refocusing pulse via the variable adapted flip angles. As is furthermore indicated by the rectangular shape of the refocusing pulses 205, the second (and possibly additional) refocusing pulses 205 are non-selective refocusing pulses.

After each of the refocusing pulses 205, a spin echo is generated that is measured as magnetic resonance data (not shown).

The gradients to be activated are shown schematically and as examples in the lower three lines of FIG. 2. In the shown case, gradients $G_x(t)$, $G_y(t)$ and $G_z(t)$ are activated in all three spatial directions x, y and z. In the shown example, spoiler gradients 207 are activated before and after the first refocusing pulse 203 in order to reduce stimulated echoes and FID proportions of the first radio-frequency pulse, and therefore to increase the image quality.

In an embodiment according to FIG. 2, all refocusing pulses 203 and 205 are thus non-selective. Under the circumstances, FID (FID: "free induction decay") artifacts that are occurring from the non-excited volume can be compensated in a reconstruction of image data from the measurement data by techniques known as phase cycling methods, with typical averaging methods. Magnetic resonance data which are free of aliasing artifacts are therefore acquired in a simple manner, wherein the measurement time is economically reasonable due to the limitation of the excitation to a selected region. The reconstruction of the image data from the measurement data hereby thus include a phase cycling method, so a qualitatively high-grade image data can be obtained from the acquired magnetic resonance data.

Figure 3:
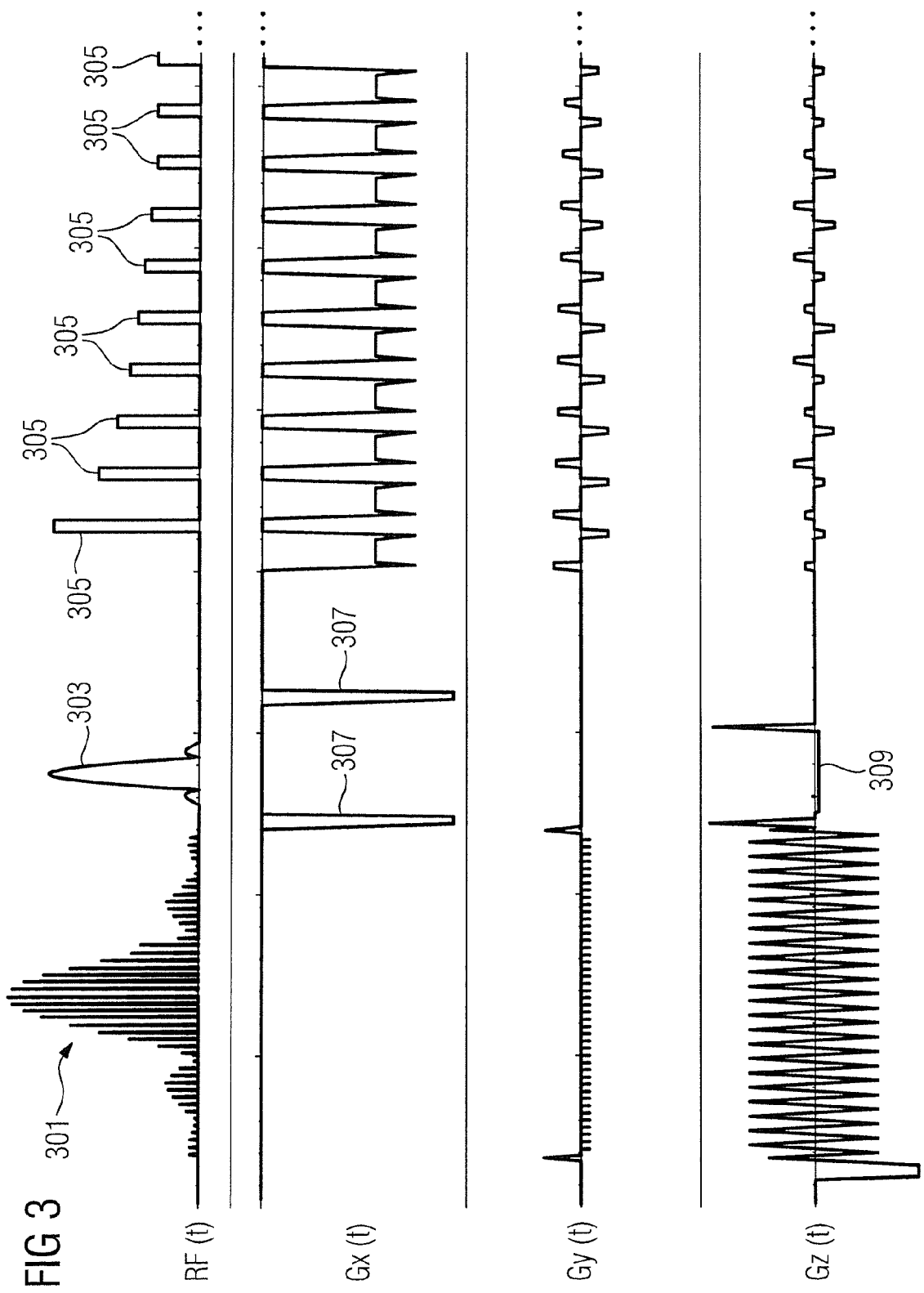
FIG. 3 shows another example of a pulse sequence that can be used in the method according to the invention.

FIG. 3 shows a variant of a pulse sequence scheme as it can be used in another embodiment of the present invention.

The radiated radio-frequency pulses are shown again in the upper line (RF(t)): a spatially selected excitation pulse 301 is initially radiated. In the shown example, this is again a 3D-selective excitation pulse that is radiated and generated simultaneously by means of one or more transmission antennas. Flexible excitation pulses that excite only a desired area in the examination subject can be generated by the use of multiple transmission antennas.

After the spatially selected excitation pulse 301, a first refocusing pulse 303 is radiated that refocuses the spins. The essential difference of FIG. 3 relative to FIG. 2 is that the first refocusing pulse 303 is a selective pulse (for example a slab-selective pulse), as is also indicated by the sinc shape of the first refocusing pulse 303. The selectiveness of the excitation pulse 301 can be reduced by one dimension since the first refocusing pulse 303 acts selectively in this dimension.

Here as well, at least one additional refocusing pulse 305 follows after the first refocusing pulse 303, such that a series of at least two refocusing pulses follows a spatially selective excitation pulse 301. Up to a few thousand refocusing pulses can thereby be included in a series of refocusing pulses, for example on the order of 200 to 500 pulses or up to approximately 3000 refocusing pulses. As is indicated by the decreasing amplitude of the refocusing pulses 305 of the series of at least two refocusing pulses, the refocusing pulses 305 generate variable flip angles respectively adapted to a predetermined signal curve. The signal curve is dependent on a predetermined substance with which the selected region is filled. Upon readout of the magnetic resonance data generated by the refocusing pulse, a predetermined signal strength can be achieved for the respective refocusing pulse via the variable adapted flip angles. As is indicated by the rectangular shape of the refocusing pulses 305, the second (and possibly additional) refocusing pulses 305 are non-selective refocusing pulses.

The gradients to be switched are presented schematically and as examples in the lower three lines of FIG. 3. In the shown case, gradients $G_x(t)$, $G_y(t)$ and $G_z(t)$ are again switched in all three spatial directions x, y and z. In the shown example, in particular what are known as spoiler gradients 307 are switched before and after the first refocusing pulse 303 in order to reduce stimulated echoes and FID proportions of the first radio-frequency pulse, and therefore to increase the image quality. Furthermore, a slice-selection gradient 309 is switched while the selective first refocusing pulse 303 is radiated. In the shown example, this is switched in the z-direction, whereby the first refocusing pulse 303 is selective in this direction. Alternatively, during the selective first refocusing pulse 303 a gradient could also be activated in a different direction if the first refocusing pulse 303 should not be selective in this direction (for example in the y-direction).

In that the first refocusing pulse 303 is a selective pulse in an embodiment according to FIG. 3, a spatial selectiveness of the excitation pulse 301 in the x-y plane can also be sufficient, for example, and the measurement region—i.e. the region in which spin echoes are excited and measured—can also be "cut out" in the z-direction via only the first refocusing pulse 303.

Figure 4:
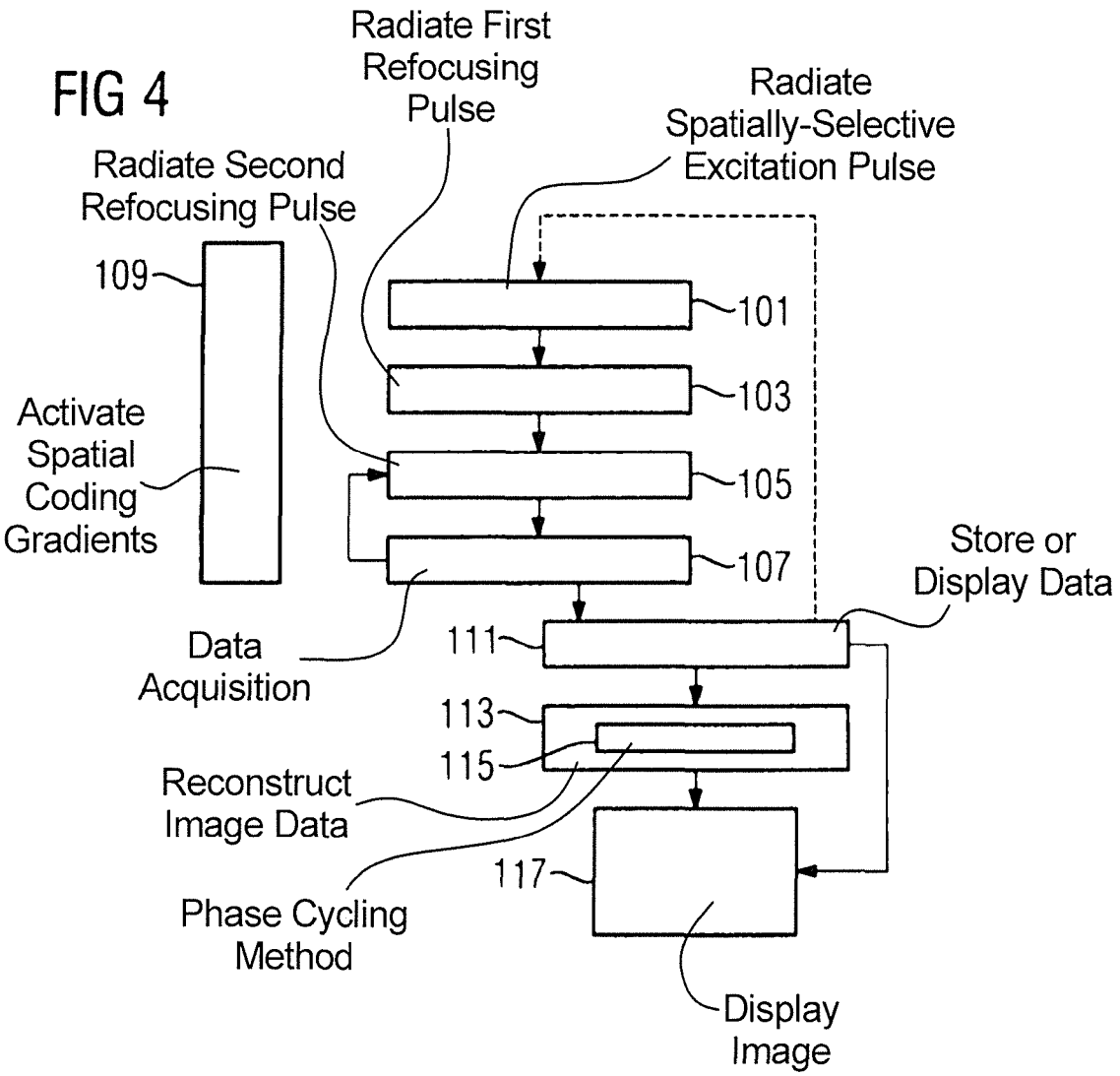
FIG. 4 is a flowchart of an exemplary embodiment of the method according to the invention.

FIG. 4 shows a schematic workflow diagram of a method according to the invention.

First, a spatially selective excitation pulse is radiated into the examination subject, which excites the nuclear spins in the examination subject in a selected region (Block 101).

After the spatially selective excitation pulse, a first refocusing pulse is radiated into the examination subject (Block 103), followed by at least one second refocusing pulse (Block 105), such that a series of at least two refocusing pulses is radiated into the examination subject. The first refocusing pulse in Block 103 is thereby either a selective pulse or a non-selective pulse. However, the additional refocusing pulses in Block 105 are all non-selective. Furthermore, the radiated refocusing pulses generate variable flip angles adapted to a predetermined signal curve. The spin echo signals generated by the refocusing pulses are acquired as magnetic resonance data (Block 107). If more than one additional refocusing pulse should be radiated after the first refocusing pulse, the blocks 105 and 107 are repeated until the desired number of refocusing pulses has been radiated. Following this, what is known as an echo train for the selected region (which was excited with the excitation pulse from Block 101) is ended. One echo train can be sufficient in order to acquire the entire desired data space of the selected region. However, more than one echo train can be used.

After the radiation of the spatially selective excitation pulse (Block 101), the radiation of the refocusing pulses (Blocks 103 and 105) and during the data acquisition (Block 107), gradients for spatial coding are activated (Block 109) as is described above with regard to FIGS. 2 and 3, for example.

The acquired magnetic resonance data are stored for further processing or for a display (Block 111). for example, image data can be reconstructed from the acquired magnetic resonance data (Block 113), wherein the reconstruction of the image data from the acquired magnetic resonance data possibly includes a phase cycling method as already described above (Block 115). Furthermore, the acquired magnetic resonance data and/or the image data reconstructed from the acquired magnetic resonance data are displayed at a suitable display device, for example a monitor (Block 117).

In one embodiment of the method, the enumerated steps of the method—in particular Steps 101 through 111—are repeated with different selected regions until a desired complete volume has been acquired. A region that is larger overall—for example a three-dimensional region—can therefore also be covered by selecting different adjacent sub-regions (what are known as slabs) as selected regions. This is indicated by the dashed arrow from Block 111 back to Block 101 in FIG. 4.

In one embodiment, the entirety of k-space is not scanned in the acquisition of the magnetic resonance data, but rather only a sufficient part of the selected region of corresponding k-space. The "missing" data are then supplemented in a known manner via corresponding algorithms, for example via what are known as half-Fourier or partial Fourier methods. An additional time savings in the complete measurement can be achieved in this way.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to acquire magnetic resonance data comprising:
   (a) operating a magnetic resonance data acquisition unit, in which an examination subject is located, to radiate a spatially-selective excitation pulse, which is by itself spatially-selective, into the examination subject, said spatially-selective excitation pulse, by itself exciting nuclear spins at least in a selected region of the examination subject that is limited in three spatial directions, and thereby creating, at least with said spatially-selective excitation pulse, spin echo signals that originate only in said selected region;
   (b) after radiating the excitation pulse, operating the magnetic resonance data acquisition unit to radiate a series of at least two refocusing pulses into the examination subject, which generate variable flip angles adapted to a predetermined signal curve, with at least a second of said refocusing pulses in said series being radiated as a non-selective pulse;
   (c) operating the magnetic resonance data acquisition unit to acquire said spin echo signals as magnetic resonance data;
   (d) operating the magnetic resonance data acquisition unit to activate spatial coding gradients before and after radiating the spatially selective excitation pulse, the refocusing pulses, and during the acquisition of said spin echo signals; and
   (e) in a processor, processing the acquired magnetic resonance data to generate a data file, and making the data file available in electronic form at an output of said processor.

2. A method as claimed in claim 1 comprising storing said data file.

3. A method as claimed in claim 1 comprising, in said processor, converting said magnetic resonance data into image data and making said image data available in electronic form at an output of said processor.

4. A method as claimed in claim 1 comprising radiating each of the refocusing pulses in said series, after said second refocusing pulse, as a non-selective pulse.

5. A method as claimed in claim 1 comprising radiating said spatially selective excitation pulse by parallel transmission from at least two transmission channels of a multichannel radio-frequency transmission coil of said magnetic resonance data acquisition unit.

6. A method as claimed in claim 1 comprising operating said magnetic resonance data acquisition unit to activate spoiler gradients before and after a first of said refocusing pulses, after radiating the spatially selective excitation pulse.

7. A method as claimed in claim 1 comprising radiating a first refocusing pulse that follows said spatially selective excitation pulse, as a selective pulse.

8. A method as claimed in claim 1 comprising radiating a first refocusing pulse in said series, after said spatially selective excitation pulse, as a non-selective pulse.

9. A method as claimed in claim 8 comprising reconstructing image data from the acquired magnetic resonance data using a phase-cycling method.

10. A method as claimed in claim 1 comprising repeating each of steps (a), (b), (c), to excite nuclear spins in, and acquire magnetic resonance data from, a plurality of different selected regions of the examination subject until magnetic resonance data from a predetermined complete volume have been acquired.

11. A method as claimed in claim 1 comprising entering the magnetic resonance data into an electronic memory representing k-space having a plurality of data entry points, and entering said magnetic resonance data into k-space at respective data points in k-space comprising only a portion of k-space, that is smaller than an entirety of k-space, corresponding to the selected region.

12. A magnetic resonance apparatus comprising:
a magnetic resonance data acquisition unit;
a control unit configured to operate the magnetic resonance data acquisition unit, in which an examination subject is located, to radiate a spatially-selective excitation pulse, which is by itself spatially-selective, into the examination subject, said spatially-selective excitation pulse, by itself exciting nuclear spins at least in a selected region of the examination subject that is limited in three spatial directions, and thereby creating, at least with said spatially-selective excitation pulse, spin echo signals that originate only in said selected region;
said control united being configured to operate the magnetic resonance data acquisition unit to radiate after radiating the excitation pulse, a series of at least two refocusing pulses into the examination subject, which generate variable flip angles adapted to a predetermined signal curve, with at least a second of said refocusing pulses in said series being radiated as a non-selective pulse;
said control unit configured to operate the magnetic resonance data acquisition unit to acquire said spin echo signals as magnetic resonance data;
said control unit configured to operate the magnetic resonance data acquisition unit to activate spatial coding gradients before and after radiating the spatially selective excitation pulse, the refocusing pulses, and during the acquisition of said spin echo signals; and
a processor configured to process the acquired magnetic resonance data to generate a data file, and to make the data file available in electronic form at an output of said processor.

13. A non-transitory, computer-readable data storage medium encoded with programming instructions, said data storage medium being loaded into a control and evaluation system of a magnetic resonance apparatus, that also comprises a magnetic resonance data acquisition unit, said programming instructions causing said control and evaluation system to:
operate the magnetic resonance data acquisition unit, in which an examination subject is located, to radiate a spatially-selective excitation pulse, which is by itself spatially-selective, into the examination subject, said spatially-selective excitation pulse, by itself exciting nuclear spins at least in a selected region of the examination subject that is limited in three spatial directions, and thereby creating, at least with said spatially-selective excitation pulse, spin echo signals that originate only in said selected region;
operate the magnetic resonance data acquisition unit to radiate after radiating the excitation pulse, a series of at least two refocusing pulses into the examination subject, which generate variable flip angles adapted to a predetermined signal curve, with at least a second of said refocusing pulses in said series being radiated as a non-selective pulse;
operate the magnetic resonance data acquisition unit to acquire said spin echo signals generated by the refocusing pulses, as magnetic resonance data;
operate the magnetic resonance data acquisition unit to activate spatial coding gradients before and after radiating the spatially selective excitation pulse, the refocusing pulses, and during the acquisition of said spin echo signals; and
process the acquired magnetic resonance data to generate a data file, and make the data file available in electronic form at an output of said control and evaluation system.

14. A method as claimed in claim 1 comprising creating said spin echo signals that originate only in said selected volume by a combination of said spatially-selective excitation pulse and a first of said refocusing pulses.

15. An apparatus as claimed in claim 12 comprising creating said spin echo signals that originate only in said selected volume by a combination of said spatially-selective excitation pulse and a first of said refocusing pulses.

16. A storage mediums as claimed in claim 13 comprising creating said spin echo signals that originate only in said selected volume by a combination of said spatially-selective excitation pulse and a first of said refocusing pulses.

* * * * *